United States Patent [19]

Pritchard

[11] 4,339,701
[45] Jul. 13, 1982

[54] SWITCHING FREQUENCY STABILIZATION AND LOAD FAULT DETECTION IN SWITCHING AMPLIFIERS

[76] Inventor: Eric K. Pritchard, 1702 Plymouth Ct., Bowie, Md. 20716

[21] Appl. No.: 139,596

[22] Filed: Apr. 11, 1980

[51] Int. Cl.³ .............................................. G05B 19/40
[52] U.S. Cl. .................... 318/696; 318/432; 318/434; 318/681
[58] Field of Search .............. 318/696, 685, 432, 434, 318/332, 341, 681, 599

[56] References Cited

U.S. PATENT DOCUMENTS

| | | | |
|---|---|---|---|
| 3,387,205 | 6/1968 | Tesdall | 318/434 |
| 3,855,511 | 12/1974 | Smith | 318/332 |
| 4,087,732 | 5/1978 | Pritchard | 318/696 |
| 4,140,956 | 2/1979 | Pritchard | 318/696 |
| 4,167,693 | 9/1979 | Liska et al. | 318/432 |
| 4,209,733 | 6/1980 | Narita et al. | 318/432 |

Primary Examiner—J. V. Truhe
Assistant Examiner—Eugene S. Indyk

[57] ABSTRACT

The switching amplifiers of the prior art improved by a variable hysteresis in the comparator circuitry of said amplifier. Said variable hysteresis is controlled by the power supply voltage and a frequency sensitive feedback circuit. If the amplifier load creates an excessive frequency which cannot be controlled, a fault detector circuit disables the amplifier.

36 Claims, 4 Drawing Figures

SWITCHING FREQUENCY STABILIZATION AND LOAD FAULT DETECTION IN SWITCHING AMPLIFIERS

BACKGROUND OF THE INVENTION

This invention is related to switching amplifiers for inductive loads and is an improvement to the amplifiers in my U.S. Pat. Nos. 4,100,471 and 4,140,956. In particular, this invention is a frequency stabilizer and load fault detector for dual threshold switching amplifiers. This invention is also an improvement to my copending application "Switching Transconductance Amplifier for Inductive Loads", Ser. No. 89,678.

Stepping motors are a type of synchronous motor which may be driven over a wide range of speeds including zero. The low frequency energization of stepping motors must be current limited to keep the motor from incineration. The prior art contains many approaches to limiting the motor current. Of these, switching amplifiers provide the greatest efficiency. The switching amplifier disclosed herein is the single voltage type and not the dual voltage variety which uses the higher voltage to rapidly reach the desired current level and a lower voltage to sustain the current and to maintain a motor position without excessive motor temperature rise.

Even among the single voltage switching amplifiers there are different designs. One technique allows the inductive current to rise rapidly to a predetermined level after which the current is allowed to delay until the end of a fixed frequency clock period. Alternately, upon reaching the predetermined level, the current is allowed to decay for a fixed period. Both of these designs employ a fixed timing. Although fixed timing techniques limit amplifier dissipation and audible noises from the motor, fixed timing techniques have poor high speed performance when used in fractional stepping or microstepping motor drives. The operation of stepping motors at elevated stepping rates have often suffered from mid-frequency resonance. Mid-frequency resonance is the rotor oscillation whose frequency is unrelated to any motor drive frequency. Mid-frequency resonance is created by the reduction of the stabilizing damping forces. Although this occurs only in voltage driven motors, stepping motors exhibit this phenomenon even with current drives at high speeds because at high speeds the current amplifiers are no longer compliant and exhibit the voltage drive characteristic which creates mid-frequency resonance.

The dual threshold switching amplifier of my U.S. Pat. No. 4,140,956 depends upon the inductance of the load and the voltage of the power supply to determine the switching frequency. If the motor is shorted the inductance is drastically lowered and the switching frequency rises significantly. The high frequency causes the amplifier to dissipate excessively and to fail. A wiring short may also shunt current away from the amplifier current feedback making it switch more rapidly, often with the same failures.

The amplifier of my U.S. Pat. No. 4,140,956 has a ground-referenced input which is subject to ground current induced noise. This is a disadvantage because ground current noise creates spurious oscillations in the switching amplifier.

SUMMARY OF THE INVENTION

The first object of this invention is a frequency stabilizing means for a dual threshold switching amplifier. The stabilizing means adjusts the difference between the thresholds to hold the switching frequency constant.

The second object of this invention is a threshold adjustment means which lowers the difference between the switching thresholds to maximize amplifier responsiveness to combat mid-frequency resonance.

The third object of this invention is a means for detecting load faults and wiring shorts and a means of disabling the amplifier upon the detection of a fault.

The fourth object of this invention is a differential input for minimizing input noise.

DESCRIPTION OF THE BRIDGE EMBODIMENT

The first embodiment is similar to my copending application, Ser. No. 89,678.

Figure 1:
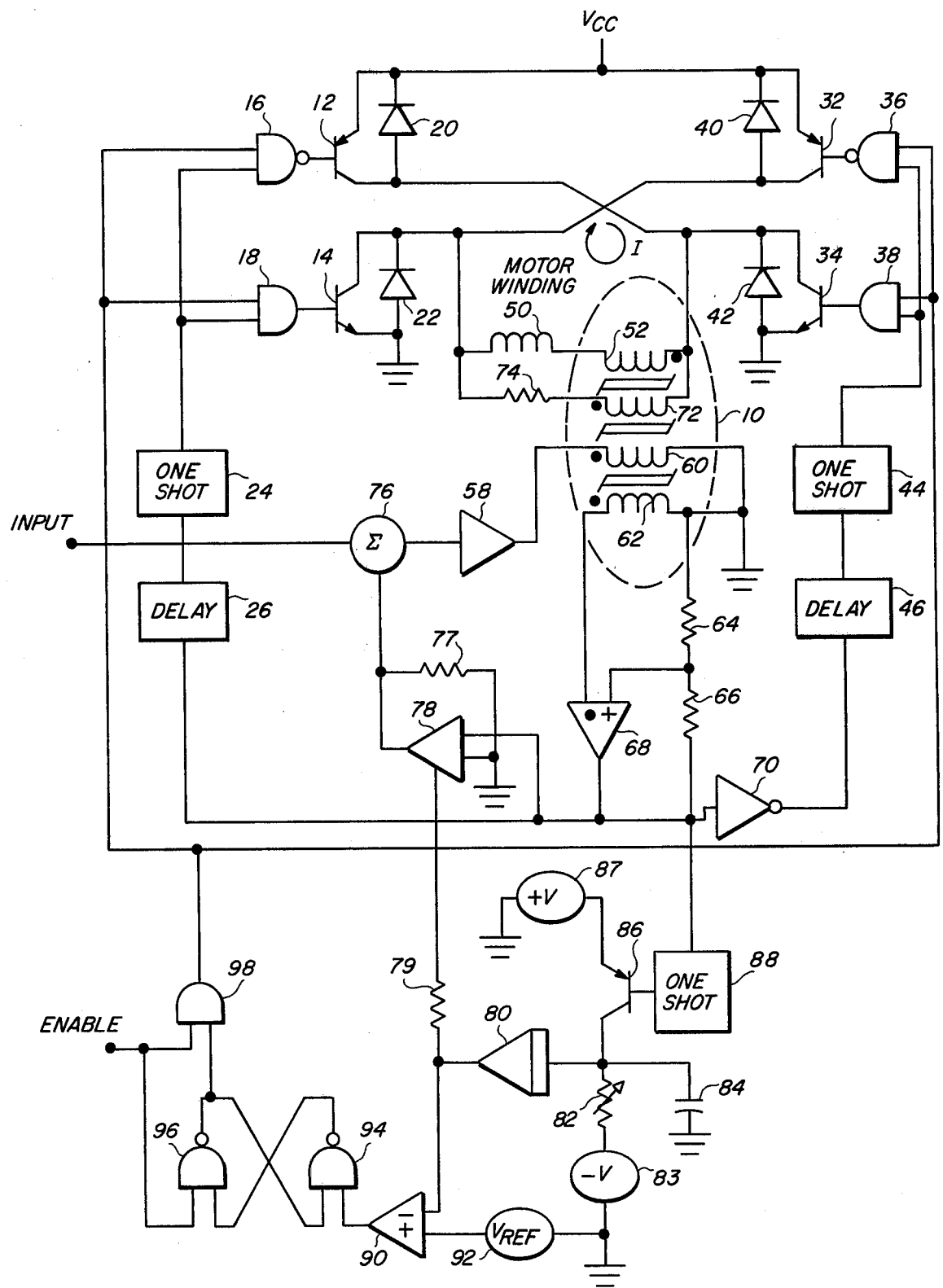
FIG. 1 shows the bridge embodiment of this invention.
Figure 2:
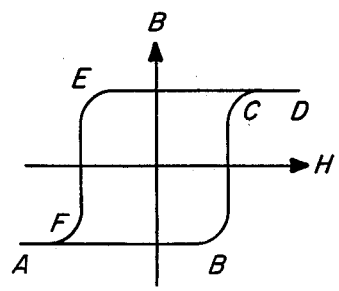
FIG. 2 depicts the B-H relationship of a square-loop transformer material.

The switching transconductance amplifier for the inductive loads of the present invention will now be described. The amplifier shown in FIG. 1 is symmetrical, components 12 through 26 being symmetrical to components 32 through 46, respectively. The amplifier makes use of non-linear transformer 10 for load current measurement and switching control. The transformer 10 preferably exhibits a square loop B-H response as illustrated in FIG. 2.

The supply voltage $V_{cc}$ is connected to the emitters of output transistors 12 and 32. The collector of transistor 32 is connected to load winding 50. The collector of transistor 12 is connected to winding 52 of transformer 10, which in turn is connected to winding 50. Diodes 20 and 40 are connected across the collectors and emitters of transistors 12 and 32 respectively. The collector of transistor 12 is also connected to the collector of transistor 34 and likewise the collector of transistor 32 is connected to the collector of transistor 14. The emitters of transistors 14 and 34 are connected to ground. Diodes 22 and 42 are connected across the collectors and emitters of transistors 14 and 34 respectively. The bases of transistors 12 and 32 are connected to the output of inverting gates 16 and 36, respectively. One of the inputs to NAND gates 16 and 36 are connected to the outputs of one-shots 24 and 44 respectively. The bases of transistors 14 and 34 are connected to AND gates 18 and 38 which are also connected to the output of one-shots 24 and 44 respectively. The other inputs to gates 16, 18, 36, and 38 are controlled by the enable/disable circuitry, components 80 through 98.

One-shots 24 and 44 are preferably of the clearable variety, Texas Instruments 74122, for example, with the input on pin 5 and the output on pin 8. The purpose of the one-shots is to limit the duration of conductance of the output transistors to a safe time so that in the event comparator 68 does not reflect the state of transformer 10, the output transistors do not burn up.

Figure 3:
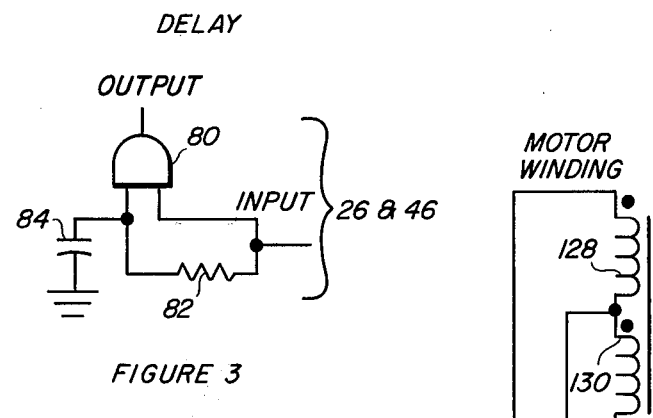
FIG. 3 details a delay circuit.

The inputs of one-shots 24 and 44 are connected to the outputs of delays 26 and 46 respectively. Delays 26 and 46 are designed to pass a high-to-low change immediately and to delay a low-to-high change. A preferred embodiment of the delays 26, 46 is shown in FIG. 3 and comprises a resistor 82, a capacitor 84 and an AND gate 80. As can be seen from FIG. 3 a high-to-low change on the delay input is immediately reproduced at the output. A low-to-high change, however, is delayed by resistor 82 and compacitor 84 before going to the output. The purpose of the delays are to insure that transistors 12, and 14, are not on when 32 and 34 are on and vice versa by providing a delay in excess of the transistor storage time.

The input of delay 46 is connected to the output of inverter 70. The input of inverter 70 is connected to a threshold network comprising the resistors 64 and 66 and the output of comparator 68. Likewise the input of delay 26 is connected to the threshold network described above. The negative input of comparator 68 is connected to winding 62 of transformer 10. The opposite end of the winding 62 connected is to ground and to resistor 64. The opposite end of resistor 64 is connected to resistor 66 and to the positive input to comparator 68. It is noted that comparator 68 and resistors 64 and 66 provide a memory function and could be replaced by another memory device with appropriate circuit changes as detailed in said copending application. The output of amplifier 58 is a current proportional to its input and drives winding 60. The opposite end of winding 60 is connected to ground.

The operation of the transformer is described as follows:

A position command signal representing a desired motor current is received at the input to amplifier 58 which converts the input to a current which is driven through winding 60 by transformer 10 to ground. This current establishes an offset flux that is magnetically coupled to winding 52. This offset flux biases the transformer and forces the transformer to operate around a level proportional to the input voltage level. This operation of the transformer around an offset level can be seen in reference to the B-H curves shown in FIG. 2. The bias caused by the input establishes the reference about which the transformer operates and is represented by the B axis in FIG. 2. As the input level changes the reference is changed to represent a new bias level, i.e., in effect the B axis is moved along the H axis.

The determination of the high and low switching points is accomplished as follows:

Suppose the transformer is biased to operate around a reference current as described above. Suppose also that a large negative current is flowing in the motor windings 50 and thus through windings 52. This condition would put the operating point at position A, FIG. 2. As the current becomes more positive the operating point moves towards point B. As can be seen from FIG. 2, the magnetization does not change significantly and the output of the transformer is nearly zero. However, when a level of current change is reached corresponding to point B a slight increase in current causes the operating point to move from point B to point C resulting in a rapid and large change in magnetization. The point B can be established as a switching point and is reached after a change in field intensity level. The time point B is reached can be determined by sensing the large change in magnetization change with a winding 62 would to produce for example, a positive pulse. If the current continues to rise, the operating point goes to point D with again little change in magnetization and near zero output. The path back to point A is similar, with point E representing a switching point and the large change in magnetization from point E to point F producing a negative pulse in winding 62. Thus the switching points are established by the characteristics of the transformer and can be adjusted by changing the turns ratio of the transformer windings. The output voltage polarity may be changed by reversing the sense winding.

The positive and negative pulses in winding 62 as described above are used as switching signals to signal that a switching point has been reached.

The operation of the circuit is described as follows:

Suppose the operating state of the circuit is such that transistors 32 and 34 have just been turned off. Transistors 12 and 14 will be turned on after the delay imposed by delay 26. The circuit behavior is dependent upon the direction of the current in winding 50. If it flows in a direction opposite to that indicated by the arrow in FIG. 1, it will create a flyback voltage. The inductive flyback causes diodes 20 and 22 to conduct the inductor current back to the power supply. Since the energy within winding 50 is decreasing the magnitude of the current decreases. If the current in winding 50 is in the direction indicated by the arrow in FIG. 1, transistors 12 and 14 will conduct current from the power supply through winding 50. This increases the energy in winding 50 and consequently the current through winding 50. In either case the rate of change of current is in the cirection indicated by I, i.e., is becoming more positive. This current which passes through winding 52 and the current in winding 60 in transformer 10 move the operating point from A to B and then to C in FIG. 2. In moving from point B to point C a rapid change of magnetization occurs which is sensed by winding 62 and as described above, is wound to produce a positive voltage pulse. When this voltage pulse exceeds the threshold voltage set by the threshold setting network comprising resistors 64 and 66 and the output of comparator 68, the comparator rapidly changes its output from a high to a low. This high-to-low change is produced at the input of delay 26 and at inverter 70 which causes low-to-high change to be produced at the input of delay 46. The high-to-low at the input of delay 26 immediately clears one-shot 24 and forces gates 16 and 18 to turn off transistors 12 and 14. After the delay period of delay 46 the one-shot 44 is triggered and causes gates 36 and 38 to turn on output transistors 32 and 34. The current, during the delay period of delay 46 and during the period transistors 32 and 34 are on, is either a flyback current from winding 50, flowing in the direction indicated by I back to $V_{cc}$ via diodes 40 and 42 and is decreasing in magnitude or is flowing opposite to the direction indicated by I and is increasing in magnitude. In either case the rate of change is in the opposite direction to that indicated by I. The transformer operating point moves from D to point E then to point F. During the E to F transition the winding 62 produces a negative pulse. When this negative pulse is less than the threshold voltage set by the threshold network comprising resistors 64 and 66 and the output of comparator 68 the comparator outputs a low-to-high change. This low-to-high change is inverted by inverter 70, passes immediately through delay 46, clears one-shot 44 and causes amplifiers 36 and 38 to turn off output transistors 32 and 34. The low-to-high change after being delayed by delay 26, causes one-shot 24 to force amplifiers 16 and 18 to turn on output transistors 12 and 14. This completes one switching cycle.

Because the operation of the transformer 10 depends upon the combination of all the currents in its windings, the operating parameters can be adjusted to satisfy various operational requirements. For example, the operation of the transformer can be weighted by adjusting the turns ratio of the respective windings. Also, the output of amplifier 58, which is the preferred embodiment is a current proportional to its input voltage representing a level of the position command signal, can be changed to reflect different required proportionality constants.

If it is desired to change the effective levels of the current about which the transformer operates, the turns of winding 60 can be increased or decreased. The current flowing in winding 60 establishes on offset flux which biases the transformer by changing the field intensity H. As described above, by changing the resultant field intensity H the transformer is forced to operate around a level proportional to the current in winding 60 and is thus proportional to the input, i.e., the position command signal. The proportionality constant is determined by the amplifier 58 and the turns ratio of the transformer 10. This overall proportionality constant determines the switching points, i.e., points B and E, FIG. 2, as described above, and thus the chopping frequency.

The current sense technique described herein can be extended to unipolar devices by using two windings in place of the single winding 50. These windings would be connected to the end of the center-tapped winding so as to measure the net current.

The additional components 72 through 98 which improve my copending application may now be explained. The hysteresis of the square loop core may be insufficient to create a reasonably low switching frequency. The effect of resistor 74 and winding 72 is to create a magnetic bias in the transformer which changes on each half cycle of the switching cycle. This alternating bias is best described as a pseudo coercive force which makes the B-H curve of FIG. 2 wider, stretching it along the H axis. The net effect of resistor 74 and winding 72 is an operation as described herein above but at a lower, more stable switching frequency. The switching frequency is more stable because the changes in the current in winding 72 compensates for the changes in the current rise time in the load. The rate of current change in the motor winding 50 is proportional to the supply voltage, $V_{cc}$. Thus for a higher supply voltage, the current changes between the two thresholds faster and produces a higher switching frequency. The winding 72 and resistor 74 react to the increased supply voltage by carrying more current and spreading the thresholds further apart. Proper sizing of resistor 74 will hold the switching frequency constant inspite of voltage changes.

The benefit of this improved stability is the limitation of switching transistor dissipation. The prior art switching frequency is proportional to voltage. The transistor dissipation is proportional to the supply voltage and the switching frequency and therefore is proportional to the square of the supply voltage. This rapidly creates excessive transistor heating and failures. The inclusion of resistor 74 and winding 72 limits the dissipation to be proportional to voltage.

Unfortunately, voltage shifts are not the only source of frequency shifts. Changes in the motor inductance created by moving motor geometries and magnetic non-linearities also give rise to frequency shifts. Winding inductances increase as motor teeth become aligned and decrease as motor current becomes greater. Unfortunately, there is no signal available to compensate for the consequential frequency shifts in a feed forward manner. Consequently, the compensation must be derived from the comparator in a feedback manner.

The frequency stabilizing feedback is created by components 76 through 88. One shot 88 is triggered on each cycle of comparator 68 to produce a short pulse which turns on transistor 86 and charges capacitor 84 to a positive reference voltage. Resistor 82 discharges said capacitor towards a negative reference voltage. The integrator 80 integrates the resulting capacitor voltage and creates a bias current via resistor 79 in the operational transconductance amplifier 78. This amplifier creates a voltage across resistor 77. The magnitude of said voltage is proportional to the output of the integrator and in a polarity dictated by the comparator 68. This signal is then added to the input by summer 76 and consequently partially controls the transconductance amplifier 58 and the current in winding 60.

This circuitry operates in the following feedback manner. If the switching frequency is too low the voltage on capacitor 84 averages to a negative value which causes the output of integrator 80 to lower the bias on transconductance amplifier 78 which lowers the signal in the transconductance amplifier 58 and winding 60. Since this signal changes with the comparator, it too acts as a pseudo coersive force which is being diminished. As mentioned above, this increases the switching frequency to compensate for the lowering of the switching frequency. Conversely, if the switching frequency is driven too high, the voltage on capacitor 84 has a positive average which forces the integrator output to rise. This creates a larger bias in amplifier 78 and ultimately a larger signal in winding 60 which lowers the switching frequency.

A short in motor winding 50 could create an apparent inductance so low that the consequential high switching frequency cannot be compensated by practical levels of pseudo coersive forces. Ultimate burnout of transistors 12, 14, 32, and 34 can only be avoided by turning off the amplifier with a protection circuit.

A protection circuit is formed with components 90 through 98. If the output of integrator 80 exceeds a reference voltage 92, the comparator 90 sets the RS flipflop formed with NAND gates 94 and 96. This forces the output of gate 98 low which turns off all of the transistors via gates 16, 18, 36, and 38. This saves the transistors from failure. NAND gates 94 and 96 may be reset by a low level on the enable control signal. Operation may be resumed when said enable signal is returned to a high level.

DESCRIPTION OF THE SECOND PREFERRED EMBODIMENT

Figure 4:
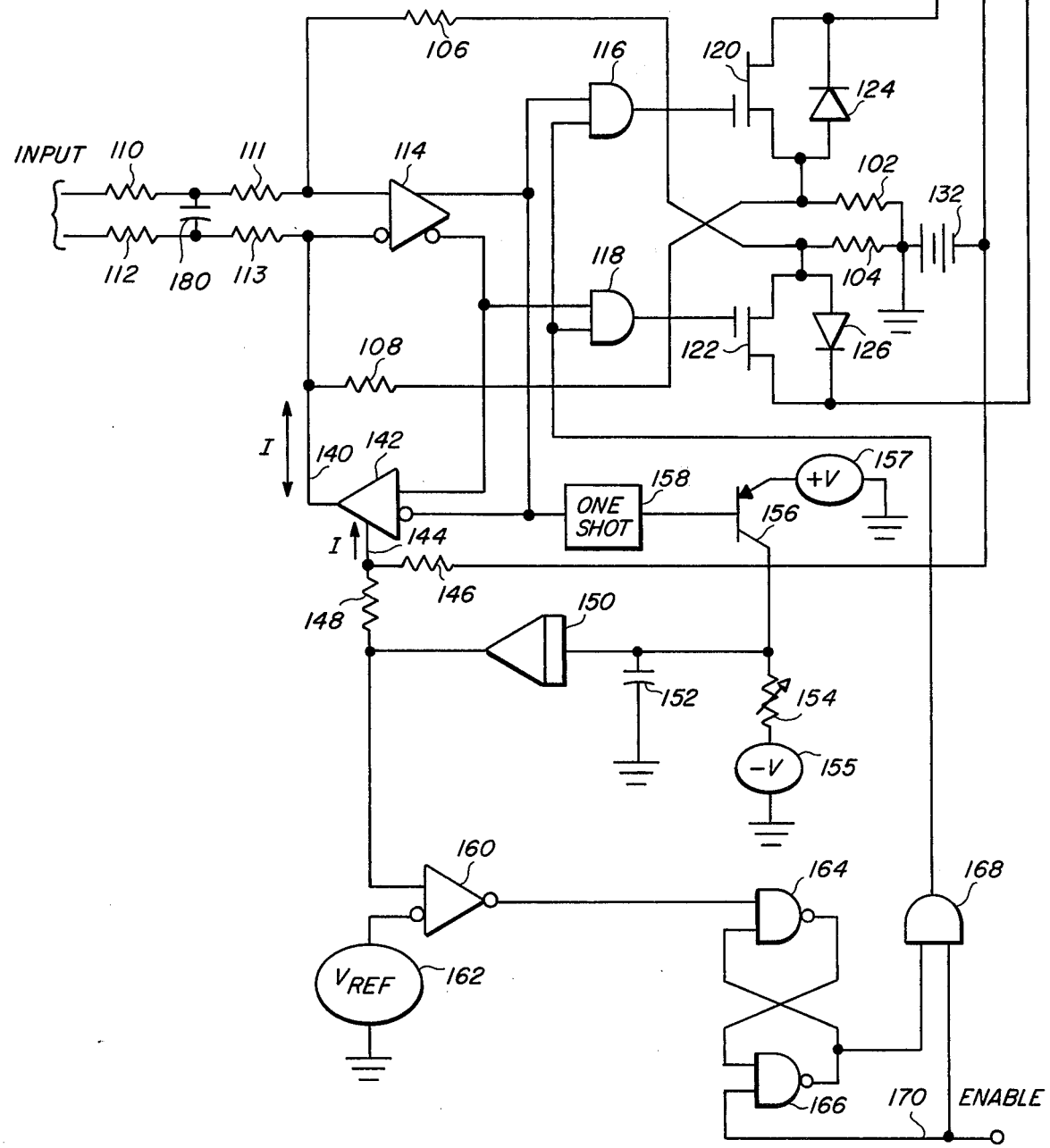
FIG. 4 illustrates the push-pull or unipolar embodiment of this invention.

The circuit of FIG. 4 is similar to my previously disclosed amplifier circuits, U.S. Pat. Nos. 4,100,471 and 4,140,956. The switching amplifier oscillates to control the motor current to be approximately proportional to the input voltage. This oscillation is controlled by the positive feedback around the comparator, by the motor supply voltage, by the motor inductances, and by the motor generated voltages. The controls over the motor current and the oscillation frequency are maintained by negative feedback.

The motor currents are measured by resistors 102 and 104. The differential voltage measurement across these resistors is approximately proportional to the net flux producing current in the motor windings 128 and 130. Resistors 106, 108, 110, 111, 112, and 113 from a bridge used to compare the input voltage with sensed voltage across resistors 102 and 104. The balance of the bridge is sensed by the differential comparator 114. This comparator drives AND gate 116 and transistor 120 with its non-inverted output and drives AND gate 118 and transistor 122 with its inverting output. These transistors drive the output windings 128 and 130. The motor current is supplied by supply 132. Diodes 124 and 126 catch the inductance flyback of the motor so that it is measured by resistors 102 and 104 and recirculates the energy to the supply 132. The circuit as described so far, if made of linear devices, would be a linear amplifier with negative feedback.

The oscillation is created by the positive feedback injected into the bridge via signal path 140 by transconductance amplifier 142. This amplifier injects a bias current 144 into 140 with a polarity commanded by the comparator 114. This bias current may be derived from one or more sources. Resistor 146 creates a bias current from the motor supply voltage 146. Resistor 148 creates a bias current from a frequency sensitive circuit made of the integrator 150, capacitor 152, resistor 154, transistor 156, and one-shot 158. This circuit supplies a negative feedback to stabilize the switching frequency.

If this frequency sensitive circuit cannot lower the frequency sufficiently to stabilize the switching amplifier, the amplifier should be turned off to avoid excessive transistor dissipation which is proportional to switching frequency. The integrator 150 output is sensed by comparator 160. When the integrator output exceeds a voltage reference 162 the comparator 160 sets the RS flipflop made of NAND gates 164 and 166. This forces both gates 116 and 118 low and forces transistors 120 and 122 off.

The circuit amplifier circuit operates symmetrically because it is differential. The effects on one component will be created in the symmetrical component in the other half of the switching cycle or when the input reverses polarity. Assume that the comparator 114 drives the gate 116 high and gate 118 low. This turns off transistor 122 and turns on transistor 120. The motor current can then flow in either transistor 120 or diode 124. If transistor 120 is conducting the current becomes larger and forces the voltage on resistor 102 to be positive and rising. If diode 124 is conducting the current decays and forces a negative voltage on resistor 102 which becomes less negative. In either case, the voltage on resistor 102 becomes more positive at a rate determined by the supply voltage 132 and the inductance of winding 128. Eventually, the change in voltage on resistor 102 overcomes the injected current 140 forcing the comparator 114 to change state. This drives gates 116 low, transistor 120 off, gate 118 high, and transistor 122 on. The change in the state also changes the polarity of the injected bias 140. Symmetrically then, either transistor 122 is conducting or diode 126 is conducting. If transistor 122 is conducting, the voltage on resistor 104 is positive and rising. If diode 126 is conducting, the voltage on resistor 104 is negative and decaying. In either case, the voltage is becoming more positive. Eventually the increasing voltage overcomes the effect of the injected bias and forces the comparator to return to its originally assumed state.

The time duration of switching cycle is roughly proportional to the bias current 144 and winding inductance. The switching cycle period is inversely proportional to the supply voltage 132. The amplifier dissipation is proportional to switching current, voltage, and frequency. Thus, if the bias current 144 were fixed then the dissipation would vary with the square of the voltage. Resistor 146, however, forces the bias to be proportional to the supply voltage and consequently stabilizes the amplifier switching frequency against supply voltage changes.

Unfortunately, the supply voltage is not the only frequency disturbing influence. A motor inductance decline forces an increase in switching frequency. Furthermore, there is no signal available to compensate. Consequently, one must be derived from the switching of comparitor 114. This comparator triggers one shot 158 once each switching cycle. The one shot 158 turns on transistor 156 and charges capacitor 152 to a positive reference 157. Resistor 154 discharges capacitor 152 towards a negative voltage reference 155. Integrator 150 filters the capacitor voltage to create a bias current with resistor 148. The output of the integrator changes with the average capacitor voltage. If the average is positive, the integrator output becomes greater and lowers the switching frequency, which in turn lowers the average capacitor voltage. Conversely, if the average capacitor voltage is negative, the integrator output becomes smaller and raises the switching frequency which also raises the average capacitor voltage. In both cases, the circuit acts with negative feedback to stabilize the switching frequency.

If the motor inductances were reduced by a short, for example, the motor currents would change rapidly and quickly force the switching of comparator 114. The resulting high frequency switching of the comparator forces the average capacitor voltage high. The integrator output voltage then rises to compensate. If this voltage rises to the level of the reference 162, the comparitor 160 output goes low and forces NAND gate 164 output high and NAND gate 166 output low. This forces the outputs of gates 168, 116, and 118 low and keeps the switching amplifier off until the enble signal goes low to reset this flipflop and goes high again. This circuit protects the amplifier from an excessive switching frequency and consequentially excessive transistor dissipation.

The stabilization circuit has a further advantage when the motor is operating in the synchronization loss prone mid-frequency region. This region is known by a motor rotor velocity variation which is unrelated to the rotor velocity. In the applicant's paper, "Another Cure for Mid-Frequence Resonance", in the 1979 Symposium on Incremental Motion Control Systems and Devices, the minimization of mid-frequency resonance is linked to sloped input waveforms and the switching amplifier's close attention to the motor current. Close attention is maintained with a small hysteresis signal. A fixed hysteresis switching amplifier is faced with the unattractive alternatives of mid-frequency resonance and high transistor dissipation. The frequency stabilizing circuit minimizes transistor heating and minimizes mid-frequency resonance. The mid-frequency region limits the motor current with motor inductance and back EMF. Consequently, the switching frequency is low. The stabilization circuit reacts by lowering the integrator output, the transconductance amplifier bias, and the size of the switching amplifier's hysteresis.

The capacitor 180 acts with the input resistors 110, 111, 112, and 113 to form a differential input filter. This filter helps stabilize the stepping motor in the mid-frequency by sloping the input waveform. The mid-frequency resonance region is characterized by inductively limited currents and large motor back EMFs. If the motor is going too fast, it creates a larger back EMF which reduces the effective winding voltage (the supply voltage less the back EMF) which reduces the current rise in the motor and sense resistors. This causes the amplifier to switch later and at a lower current and causes the motor to decelerate. Conversely, if the motor is going too slow, it creates a smaller back EMF which increases the effective winding voltage which increases the current rise in the motor and sense resistors. This causes the amplifier to switch earlier at a higher current and causes the motor to accelerate. Thus, the oscillatory motor velocity of mid-frequency resonance is damped by the sloped waveform.

The filter also suppresses the interaction of two such amplifiers by suppressing high frequency noise.

An examination of both embodiments show that the same functions can be created in both circuits. Resistors 74 and 146 both produce compensation for supply voltage shift induced switching frequency shifts. Components 76 through 88 and components 142 through 156 both form frequency sensitive circuits which serve to stabilize the switching frequency in a negative feedback manner. Furthermore each circuit is protected from external short circuits by a comparitor and flip-flop which turns off the drive.

Thus, two frequency stabilization techniques have been disclosed upon two switching amplifier circuits. Each circuit employs a current measurement means with a hysteresis which is controlled by external signals. These signals may be the load supply voltage, the voltage conversion of the switching frequency, or both. Furthermore, each circuit detects excessive switching frequency to disable itself and thereby to protect the output transistors. Although the invention has been described and illustrated in detail, it is to be clearly understood that the same is by way of illustration and example only, and it is not to be taken by way of limitation, the spirit and scope of this invention being limited only to the terms of the following claims.

I claim:

1. In a switching amplifier for driving inductive loads with output devices comprising a supply voltage; first means for sensing an input signal; non-linear transformer means responsive to said input signal for sensing the load current of said inductive load, for comparing said load current to high and low switching points of said amplifier, said switching points being a function of said transformer parameters, and for providing switching signals indicative of the load current attaining said high and low switch points; and second means for receiving said switching signal and for switching said output devices, the improvement comprising:
   means responsive to the voltage across said inductive load for controlling said switching points such that the frequency of said switching signal is stabilized against variations in said supply voltage.

2. A switching amplifier as defined in claim 1, wherein said means responsive to the voltage across said inductive load includes a series combination of a resistor and inductor means, said inductor means forming part of said non-linear transformer means.

3. A switching amplifier as defined in claim 1 wherein said amplifier also includes a delay means for delaying the current conduction of said output devices.

4. A switching amplifier as defined in claim 1, wherein said non-linear transformer means is a square hysteresis loop transformer.

5. A switching amplifier as defined in claim 1 including a frequency stabilizing means responsive to said switching signals from said second means for controlling said switching points by providing a feedback signal to said first means such that said frequency of said switching signal is stabilized.

6. A switching amplifier as defined in claim 5, wherein said frequency stabilizing means includes a sensing means for sensing the value of said frequency and converting said value to a voltage.

7. A switching amplifier as defined in claim 6, wherein said frequency stabilizing means further includes integrating means connected to said sensing means for integrating said voltage to produce a control bias current.

8. A switching amplifier as defined in claim 7, wherein said frequency stabilizing means includes a transconductance amplifier means connected between said integrating means and said first means, said control bias current being applied to said transconductance amplifier means to control said input signal.

9. In a switching amplifier for driving inductive loads with output devices comprising a supply voltage; first means for sensing an input signal; non-linear transformer means responsive to said input signal for sensing the load current of said inductive load for comparing said load current to high and low switching points of said amplifier, said switching points being a function of said transformer parameters, and for providing switching signals indicative of the load current attaining said high and low switch points; and second means for receiving said switching signal and for switching said output devices, the improvement comprising:
   frequency stabilizing means responsive to said switching signals from said second means for controlling said switching points by providing a feedback signal to said first means such that the frequency of said switching signal is stabilized.

10. A switching amplifier as defined in claim 9, wherein said frequency stabilizing means includes a sensing means for sensing the value of said frequency and converting said value to a voltage.

11. A switching amplifier as defined in claim 10, wherein said frequency stabilizing means includes integrating means connected to said sensing means for integrating said voltage to produce a control bias current.

12. A switching amplifier as defined in claim 11, wherein said frequency stabilizing means further includes a transconductance amplifier means connected between said integrating means and said first means, said control bias current being applied to said transconductance amplifier means to control said input signal.

13. A switching amplifier as defined in claim 9 including means responsive to the voltage across said inductive load for independently controlling said switching points such that said frequency of said switching signal is stabilized against variations in said supply voltage.

14. A switching amplifier for driving inductive loads with output devices from a power supply voltage using a load current approximately proportional to an input signal, comprising:

hysteresis means having low and high switch point values responsive to said input signal and said load current for producing a switching signal indicative of the difference between said load current and a value proportional to said input attaining one of said switch point values;

gate means for connecting said switching signal to said output devices; and frequency sensitive means responsive to the frequency of said switching signal for controlling said switch point values of said hysteresis means.

15. A switching amplifier for driving inductive loads as described in claim 14, wherein said frequency sensitive means incudes a transconductance amplifier for producing a positive feedback signal such that said switching amplifier oscillates.

16. A switching amplifier for driving inductive loads as described in claim 15, wherein said frequency sensitive means includes a means responsive to said power supply voltage for controlling said switching points such that the frequency of said switching signal is stabilized against variations in said supply voltage.

17. A switching amplifier for driving inductive loads as described in claim 16, wherein said means responsive to said power supply voltage is a resistor which controls the bias of said transconductance amplifier.

18. A switching amplifier for driving inductive loads as described in claim 14, wherein said frequency sensitive means includes a frequency stabilizing means responsive to said switching signal for controlling said switch point values.

19. A switching amplifier for driving inductive loads as described in claim 18, wherein said frequency stabilizing means includes a sensing means for sensing the value of said frequency and converting said value to a voltage.

20. A switching amplifier for driving inductive loads as described in claim 19, wherein said frequency stabilizing means includes a integrating means connected to said sensing means for integrating said voltage to produce a control bias current, said control bias current being applied to said transconductance amplifier for controlling said switch point values.

21. A switching amplifier as defined in claim 14, wherein said hysteresis means includes a filter means responsive to said input signal to stabilize said inductive load against mid-frequency resonance.

22. A switching amplifier as defined in claim 21, wherein said hysteresis means further includes a voltage comparator connected between said filter means and said gate means.

23. A switching amplifier as defined in claim 22, further including a detector means for detecting a short circuit in said inductive load and for turning off said output devices in response to said short.

24. A switching amplifier for driving inductive loads with output devices using a load current approximately proportional to an analog input signal, comprising:

an inductive load stabilizing filtering means for filtering said analog input signal; and hysteresis means responsive to said inductive load stabilizing filtering means and to said load current for producing a switching signal to said output devices.

25. A switching amplifier for driving inductive loads as defined in claim 24, wherein said inductive load stabilizing filtering means includes a differential filter having a capacitor, said differential filter serving to stabilize said inductive load against mid-frequency resonance by sloping the waveform of said input signal.

26. A switching amplifier for driving inductive loads as defined in claim 24, further including a frequency sensitive means responsive to the frequency of said switching signal for controlling said hysteresis means.

27. A switching amplifier for driving a load inductance with output devices and a switching signal, comprising:

an input sensing means;

a frequency sensitive means responsive to the frequency of said switching signal;

comparator means responsive to the load current in said load inductance, to said input sensing means, and to said frequency sensitive means for producing said switching signal; and gate means for driving said output devices with said switching signal.

28. A switching amplifier as defined in claim 27, wherein said input sensing means includes a differential filter means for sloping the waveform of an input signal.

29. A switching amplifier as defined in claim 28, wherein said frequency sensitive means includes a means responsive to the voltage across said inductive load.

30. A switching amplifier as defined in claim 27, further including a detector means for detecting a short circuit in said load inductance and for turning off said output devices in response to said short.

31. A switching amplifier for driving inductive loads with output devices using a load current approximately proportional to an input signal, comprising:

hysteresis means responsive to said input signal and to said load current for controlling said output devices with a switching signal; and detector means responsive to the frequency of said switching signal for detecting a short circuit in said load inductance and for turning off said output devices in response to said short.

32. A circuit for controlling a switching device in a means for energizing an inductive load from a power source in response to an input comprising:

a hysteresis means having low and high switch point values responsive to said input signal and a feedback signal from said load for producing a switching signal for controlling said switching device in response to the combination of said input and said feedback signals attaining one of said switch point values; and frequency sensitive means responsive to the frequency of said switching signal for controlling said switch point values.

33. The circuit of claim 32 wherein said frequency sensitive means includes a transconductance amplifier for controlling the difference between said low and high switch point values.

34. The circuit of claim 33 wherein said frequency sensitive means includes sensing means for sensing the value of said frequency and converting said value to a voltage.

35. The circuit of claim 34 wherein said frequency sensitive means includes an integrating means connected to said sensing means for controlling the bias of said transconductance amplifier for controlling said switch point values.

36. The circuit of claim 32 wherein said circuit includes a detector means for detecting a short circuit in said load and for turning off said output devices in response to said short.

* * * * *